United States Patent [19]

Marukawa et al.

[11] Patent Number: 5,578,844
[45] Date of Patent: Nov. 26, 1996

[54] SEMICONDUCTOR ELEMENT AND PROCESS FOR PRODUCTION FOR THE SAME

[75] Inventors: Takashi Marukawa; Hiroyuki Nakano, both of Nagaokakyo, Japan

[73] Assignee: Murata Manufacturing Co., Ltd., Japan

[21] Appl. No.: 607,817

[22] Filed: Feb. 27, 1996

Related U.S. Application Data

[63] Continuation of Ser. No. 301,961, Sep. 7, 1994, abandoned.

[30] Foreign Application Priority Data

Sep. 7, 1993 [JP] Japan .................................. 5-222555
Jul. 28, 1994 [JP] Japan .................................. 6-197888

[51] Int. Cl.$^6$ .......................... H01L 29/80; H01L 31/112
[52] U.S. Cl. ............................................. 257/280; 257/284
[58] Field of Search ..................................... 257/280, 284

[56] References Cited

U.S. PATENT DOCUMENTS

| | | |
|---|---|---|
| T944,004 | 3/1976 | Altman et al. . |
| 4,742,026 | 5/1988 | Vatus et al. .............................. 257/284 |
| 5,223,458 | 6/1993 | Shanfield et al. ........................ 437/225 |

FOREIGN PATENT DOCUMENTS

| | | |
|---|---|---|
| 0021869 | 1/1981 | European Pat. Off. . |
| 0070810 | 1/1983 | European Pat. Off. . |
| 59-16383 | 1/1984 | Japan . |
| 59-163872 | 9/1984 | Japan . |
| 63-60570 | 3/1988 | Japan . |
| 449626 | 2/1992 | Japan . |
| 4291932 | 10/1992 | Japan . |
| 2222304 | 2/1990 | United Kingdom . |

OTHER PUBLICATIONS

Patent Abstracts of Japan, vol. 15, No. 204 (E–1071) 24 May 1991 & JP–A–03 057 228 (NEC Corp) 12 Mar. 1991 * abstract *.

Patent Abstracts of Japan, vol. 16, No. 158 (E–1191) 17 Apr. 1992 & JP–A–04 010 549 (Nippon Mining Co Ltd) 14 Jan. 1992 * abstract *.

Patent Abstracts of Japan, vol 16, No. 23 (E–1157) 21 Jan. 1992 & JP–A–03 240 243 (OKI Electric Ind Co Ltd) 25 Oct. 1991 * abstract *.

Proceedings of the Eighteenth International Symposium on Gallium Arsenide and Related Compounds, 1991, Seattle, Washington, USA, 9–12 Sep. 1991, pp. 199–202, Yukiharu Shimamoto et al., 'Improvement of breakdown voltage characteristics of GaAs junction by damage–creation of ion–implementation'.

Semiconductor Science and Technology, vol. 7, No. 5, May 1992, London GB, pp. 695–687, Eun Kyu Kim et al. 'Schottky Diode Characteristics and Deep Levels on Hydrogenated N-Type GaAs'.

Applied Physics Letters, vol. 55, No. 3, 17 Jul. 1989, New York US, pp. 259–261, E. Latta et al., 'Schottky diodes on hydrogen plasma treated n–GaAs surfaces'.

Shinshu University Technical Report ED91–151, pp. 95–99 (1991), Naotaka Iwata et al., "High–Power GaAs MESFETs with i–GaAs Layers on the Channels" with its English abstract.

Shinshu University Technical Report ED91–152, pp. 101–105 (1991), Hidemasa Takahashi et al., "Undoped Surface Layer Recessed–Gate Power MES " with its English abstract.

(List continued on next page.)

*Primary Examiner*—Stephen Meier

[57] ABSTRACT

There is provided a semiconductor element having a Schottky electrode which forms a Schottky junction with an active layer formed on a compound semiconductor substrate characterized in that a modified layer is formed in at least a portion of a region of the active layer on which region the Schottky electrode is formed and a vicinity of that region.

9 Claims, 13 Drawing Sheets

OTHER PUBLICATIONS

Inst. Phys. Conf. Ser. No. 120: Chapter 3, pp. 119–124 (1992), Naotaka Iwata et al., "Extensive study on the effects of undoped GaAs layers on MESFET channels and its application for Ku-band extra high output power devices".

IDEM 91, pp. 259–262 (1991), H. Takahashi et al., "Step-Recessed Gate GaAs FETs With An Undoped Surface Layer".

IEEE Electron Device Letters, vol. 13, No. 6, pp. 335–337, Jun. 1992, Chang-Lee Chen et al., "High-Breakdown-Voltage MESFET with a Low-Temperature-Grown GaAs Passivation Layer and Overlappin Gate Structure".

IEEE Electron Device Letters, vol. 11, No. 12, pp. 561–563, Dec. 1990, L.-W. Yin et al., "Improved Breakdown Voltage in GaAs MESFET's Utilizing Surface Layers of GaAs Grown at Low Temperature by MBE".

Shinshu University Technical Report SSD85–130, pp. 23–28 (1985), S. Asai et al., "LDD Structure N+ GaAs MESFETs Fabricated by Pattern Inversion Method with its English abstract".

SEMICONDUCTOR ELEMENT AND PROCESS FOR PRODUCTION FOR THE SAME

This is a continuing application based on application Ser. No. 08/301,961 filed on Sep. 7, 1994, now abandoned.

BACKGROUND OF THE INVENTION

1. Field of the Invention

The present invention relates to a semiconductor element (or semiconductor device) and a process for the production of the same. Particularly, the present invention relates to a semiconductor element and a process for the production of such an element which contains an electrode forming a Schottky junction such as a field effect transistor (FET) (for example a GaAsMESFET (metal-semiconductor field effect transistor) or an HEMT (high electron mobility transistor)), a Schottky barrier diode and so on.

2. Description of the Related Art

GaAsMESFET

A GaAs FET containing a Schottky gate (hereinafter, referred to as "GaAsMESFET") has been used as a semiconductor element, for supplying a high output in a high frequency band, such as a high frequency amplifying element, due to its good high frequency characteristics (especially, its high speed response).

Generally, the GaAsMESFET has drain withstand voltage and a low gate withstand voltage are small because of the effects of a high density surface defect state in an active layer surface of a GaAs substrate and an electric field concentration in the active layer immediately below a gate electrode. It is necessarily desired for a high output GaAsMESFET to improve its drain withstand voltage and the gate withstand voltage for the purpose of the improvement of its output power limit and also its reliability.

FIGS. 34 to 36 generally show a sequence of a process for the production of a GaAsMESFET (71) wherein the transistor is shown as its cross sectional view. In the process, a positive-type (hereinafter referred to as "p-type") impurity is implanted into a surface layer of a semi-insulation GaAs substrate (40) to form a p-type active layer (41), then a negative-type (hereinafter referred to as "n-type") impurity is implanted to form a n-type active layer (42), further an n-type impurity is implanted in a source region and a drain region to form an $n^+$-type active layer (43) on each side of the n-type active layer (see FIG. 34), and then an ohmic metal is placed on the $n^+$-type active layers (43) to form a source electrode (44) and a drain electrode (45) (see FIG. 35). Then, a gate electrode (47) is provided in a recess (46) prepared by etching a portion of the n-type active layer (42) (see FIG. 36).

Thus, an electric field strength near the drain electrode (45) is lowered by providing the $n^+$-type active layers (43) in the source region and the drain region, whereby the drain withstand voltage is improved. In addition, the electric field concentration near the gate electrode (47) and the drain electrode (45) is decentralized so as to lower the electric field strength, so that the drain withstand voltage and the gate withstand voltage are improved.

However, the withstand voltages of the element having a structure as shown in FIG. 36 are not sufficiently low. Therefore, in respect of the GaAsMESFET, suppression of tunneling, improvement of a barrier height, and improvement of the gate withstand voltage in various manners, have been attempted. For example, the decentralization of the electric field concentration in the active layer and lowering of a leakage current as well as the improvement of the withstand voltage with a LDD (Lightly Doped Drain) structure and a multi-step recess structure have been studied and practically carried out. Concrete improvements are, for example, (1) the improvement of the barrier height by properly selecting a metal for the gate electrode; (2) the improvement of the gate withstand voltage by a specific treatment of a GaAs substrate interface; and (3) the improvement of the gate withstand voltage by providing a buffer layer on the active layer of a GaAs substrate.

FIG. 37 shows a GaAsMESFET (72) having the LDD structure in its sectional view, in which an n'-type layer (48) having a lower carrier concentration than an $n^+$-type active layer (43) is formed between an n-type active layer (42) carrying a gate electrode (47) and each $n^+$-type active layer (43) carrying a source electrode (44) and a drain electrode (45). Thus, an excess-strength of an electric field at an interface between the $n^+$-type active layer (43) and n-type active layer (42) is suppressed so that the drain withstand voltage and the source withstand voltage are improved.

FIG. 38 shows a GaAsMESFET (73) in its cross sectional view which has a buffer layer provided on a GaAs substrate (51). As the buffer layer, one undoped surface layer (53) is formed on an active layer (52) which is on the GaAs substrate (51).

The GaAsMESFET (73) as shown in FIG. 38 is produced by the following procedures: The undoped surface layer (53) is formed on the active layer (52) which is on the GaAs substrate (51), and an n-type resistive layer having a lower resistance (54) is formed on the undoped surface layer. Then, an ohmic source electrode (56) and an ohmic drain electrode (57) are formed on the resistive layer (54) before an oxide film (55) of $SiO_2$ is formed between the source electrode (56) and the drain electrode (57). Thereafter, by dry etching with masking using a patterned resist film (not shown), an opening is formed through the oxide film (55) and a recess having an sufficient depth for embedding a gate electrode is also formed. Next, the oxide film (55) is side-etched to give a predetermined recess length and the recess is etched to a predetermined depth. Finally, a gate electrode (58) is provided which forms a Schottky junction by deposition of a metal such as Al/Ti/WSi and lifting off unnecessary metal and the resist film. The gate electrode (58) is formed on the active layer (52) and extends through the undoped surface layer (53) in the example of FIG. 38. However, the gate electrode (58) may also be formed on the undoped surface layer (53).

In the GaAsMESFET (73) having the undoped surface layer (53), no current limitation occurs due to channel narrowing between the gate region and the drain region or between the gate region and source region, whereby almost the same effect as in the LDD structure or the multi-step recess structure is obtained. In addition, a surface effect based on an interface state is buffered by in the undoped surface layer (53) so that the gate withstand voltage is improved.

However, the prior art GaAsMESFET as described above having the LDD structure or the multi-step recess structure is complicated in its structure, and thus a process for the production of such an element, of course, becomes complicated, production control is difficult, reliability of the element is not enough and commercial application is also difficult. Similarly, production of the GaAsMESFET (73) as shown in FIG. 38 requires the steps of the formation of the undoped surface layer, the dry etching, for example by the RIE (reactive ion etching) process and the side etching which are complicated. It is difficult to control such a process, so the cost of production of such an element is high. Further, other elements besides those described above are also complicated in structure and their production also requires complicated steps.

Among the prior art elements, the GaAsMESFET as shown in FIG. 38 seems to provide the highest output and the highest efficiency. In such a prior art element, the active layer (52), the undoped surface layer (53) and the n-type lower resistance layer (54) as described above are formed by the epitaxial growth method. When the epitaxial growth method is applied, the undoped surface layer (53) which has a high resistance necessarily lies between the ohmic electrode (the source electrode (56) or the drain electrode (57)) and the active layer (52), which means the increase of a parasitic resistor which lies in series with a channel.

The following principles are generally applied to an output of an FET (field effect transistor). FIG. 39 shows a graph indicating its static characteristic curve of a drain current ($I_d$) as a function of a voltage ($V_{ds}$) between a source electrode and a drain electrode and also a load curve (I). When the FET is operated as a class "A" amplifier, a maximum output power ($Po_{max}$) can be calculated according to the following equation (1):

$$Po_{max} = I_{max} \times (BV_{ds} - V_{knee})/8 \qquad (1)$$

wherein $I_{max}$ is a maximum current, $V_{knee}$ is a knee voltage (which is a voltage at a bend), and $BV_{ds}$ is a breakdown voltage each of which are obtained from the graph of FIG. 39.

According to the above equation (1), in order to increase the maximum output power ($Po_{max}$), $I_{max}$ and/or $BV_{ds}$ must be increased and/or the knee voltage ($V_{knee}$) must be decreased. Generally it is necessary to lower a resistance of an element in order to increase the maximum current ($I_{max}$) or decrease the knee voltage ($V_{knee}$). On the other hand, to obtain a high withstand voltage due to the increased breakdown voltage ($BV_{ds}$) requires a higher resistance. Thus, these parameters cannot be determined independently.

In the GaAsMESFET (73) as shown in FIG. 38, the insertion of the undoped surface layer (53) makes the breakdown voltage ($BV_{ds}$) increased, resulting in the higher withstand voltage. However, a resistor component which lies in series with the channel is increased as described above and thus the maximum current ($I_{max}$) is decreased and the knee voltage ($V_{knee}$) is increased. Therefore, the maximum power ($Po_{max}$) cannot be effectively increased. In addition, in order to apply the element to a portable electric equipment, the maximum current ($I_{max}$) must be increased and the knee voltage ($V_{knee}$) must be decreased so that the element can be operated at a lower voltage with a smaller power consumption. Thus, the GaAsMESFET element having such a structure as shown in FIG. 38 which has the higher withstand voltage does not satisfy the requirements as described above. And, in addition to the problems as to the maximum output power described above, problems similar to those occur as to the efficiency of the element.

Schottky barrier diode

Another example of a semiconductor element having the Schottky junction between a semiconductor and a metal, is the Schottky barrier diode. FIGS. 40 to 42 show a sequence of a production process for the Schottky barrier diode (74) of the prior art in its cross sectional view. An n-type active layer (62) having a lower carrier concentration is formed on an $n^+$-type GaAs substrate (61) (see FIG. 40), a Schottky electrode (63) which makes a Schottky junction with the n-type active layer (62) is formed on the layer (62) (see FIG. 41), and an ohmic electrode (64) is formed on a bottom surface of the $n^+$type-GaAs substrate (61) (see FIG. 42). Thus, there occurs a depletion layer under the Schottky electrode (63) due to the semiconductor-metal contact so as to equalize the Fermi levels. When a reverse voltage is applied between the Schottky electrode (63) and the ohmic electrode (64), no reverse current can flow due to the presence of the depletion layer immediately below the Schottky electrode (63) so that the diode shows a rectifying characteristic.

In order to allow the current to flow through the Schottky barrier diode (74) in a forward direction, a potential barrier due to the depletion layer should be sufficiently low. Since applying a voltage to lower the potential barrier of the depletion layer contributes to voltage drop in the forward direction entirely, the voltage in the forward direction must be increased. The GaAs Schottky barrier diode is superior in its high frequency characteristics. However, the element has a problem that the forward voltage and power loss are larger in comparison with a silicon diode due to the above characteristic.

Further, when a reverse voltage above a certain extent is applied, avalanche breakdown occurs due to electron-hole pairs formation, and the withstand voltage on the application of the reverse voltage is determined by the avalanche breakdown. The Schottky barrier diode element has a problem that the withstand voltage on the application of the reverse voltage is small. In order to improve the withstand voltage on the reverse voltage, an impurity concentration of the GaAs substrate is decreased. However, when the concentration is decreased, a forward current is decreased, which causes characteristic problems of the diode.

SUMMARY OF THE INVENTION

The present invention is based on the above problems of the prior art, and it is an object to improve characteristics of the semiconductor element in which a Schottky junction between a semiconductor and a metal is utilized.

Further, it is a particular object of the present invention to overcome the problems of the prior art semiconductor elements and to provide a semiconductor element such as a GaAsMESFET whose withstand voltage is improved, which is less expensive and which has a reduced leakage current of the Schottky electrode, and which does not require any complicated step and any complicated installations for its production.

It is a further object of the present invention to improve forward voltage-current characteristics and reverse voltage-current characteristics of a semiconductor element such as a Schottky barrier diode in which a Schottky junction is utilized.

In a first aspect of the present invention, there is provided a semiconductor element comprising a Schottky electrode which forms a Schottky junction with an active layer formed in a top surface of a compound semiconductor (such as GaAs) substrate characterized in that a modified layer is formed in at least a portion of a region of the active layer on which the Schottky electrode is formed and in a vicinity of that region.

The modified layer has a higher resistance than that of the active layer, and it is formed by, for example, the plasma treatment.

Preferably, the modified layer is formed on a region which includes the region of the active layer on which region the Schottky junction is formed.

The semiconductor element according to the present invention may be a field effect transistor in which a Schottky electrode and two ohmic electrodes are formed on the active layer.

Alternatively, the semiconductor element according to the present invention may be a Schottky barrier diode in which a Schottky electrode is formed on the active layer. In this case, the modified layer may be formed in a region immediately below a periphery of the Schottky electrode and a region which is adjacent to said region. Alternatively, the modified layer may be formed in a region immediately below the entire Schottky electrode or in a region which is within said region. Further, the Schottky electrode may be formed on a region which is within the modified layer.

In a second aspect of the present invention, there is provided a process for the production of the semiconductor element according to the first aspect of the present invention comprising the steps of forming an active layer in a top surface of a compound semiconductor (such as GaAs) substrate and forming a Schottky electrode which forms a Schottky junction with the active layer characterized in that at least a portion of a region of the active layer on which the Schottky junction is to be formed and a vicinity of said region is subjected to plasma treatment to modify said at least a portion so that a modified layer is formed, and then the Schottky electrode is formed on the active layer in contact with or adjacent to the modified layer.

It is preferable for the modified layer to be formed on the region of the active layer where the Schottky electrode is to be formed and its vicinity, and then the Schottky electrode is formed on the modified layer.

DETAILED DESCRIPTION OF EMBODIMENTS OF THE INVENTION

Figure 1:
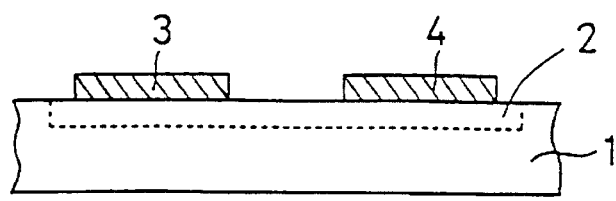
FIG. 1, FIG. 2, FIG. 3, FIG. 4 and FIG. 5 each schematically show a step of one embodiment of a process for the production of a GaAsMESFET (Example 1) according to the present invention using a cross sectional view of the transistor.

The present invention will be, hereinafter, explained in detail with reference to the GaAsMESFET or the Schottky barrier diode as an example of the semiconductor element according to the present invention which has one Schottky electrode for the simplicity of the description. However, it should be noted that the present invention is also applicable to the element which has a plurality of the Schottky electrodes. As to the other electrode(s) except the Schottky electrode, more than two ohmic electrodes (in the case of the GaAsMESFET) or more than one ohmic electrodes (in the case of the Schottky barrier diode) may be present in one element.

According to the present invention, characteristics of the semiconductor element are improved by providing the modified layer (which has been modified to have a higher resistance) in at least a portion of the region of the active layer on which the Schottky electrode is to be formed and the vicinity of the region. It is contemplated that such improvements are derived from reduction of a carrier concentration in the region of the active layer immediately below the Schottky electrode and its vicinity and/or change of surface state density due to the modification of the active layer. It is also contemplated that the electric field concentration is decentralized at an edge of the Schottky electrode.

Since the application of the plasma treatment to the active layer to form the modified layer is easy, the structure of the semiconductor element and also the production steps thereof do not become complicated, which means that the element characteristics are improved with a simple means.

For example, the FET in which the modified layer of the active layer is formed in the region on which the Schottky electrode is formed has a lower carrier density in said region and change of the surface state density is induced in said region. As a result, a thin higher resistance layer is formed under the gate electrode, which suppresses an effect of the surface state which is said to highly affect the gate withstand voltage and so on. Therefore, the element characteristics are improved: For example, the gate withstand voltage is improved; and the current leakage at the gate electrode is lowered.

The modified layer which is formed in the region immediately below the periphery area of the Schottky electrode and the region which is adjacent to said region in the Schottky barrier diode decentralizes the electric field concentration at the edge of the Schottky electrode, which leads to the improvement of the reverse characteristics of the diode.

In addition, the modified layer which is formed in the region within the area immediately below the entire Schottky electrode or the region which is inside of said region in the Schottky barrier diode makes the barrier height low, which leads to the improvement of the forward characteristics of the lo diode.

Further, the modified layer which is formed in the region immediately below the entire Schottky electrode and the region which outwardly protrudes from said region (namely, the outer region of said region) in the Schottky barrier diode provides the improvement of the characteristics both in the forward and the reverse directions of the diode.

When the modified layer is formed with the plasma treatment using oxygen and/or in an atmosphere comprising oxygen, an exposed surface of the modified layer is generally oxidized to form an oxide film which may cause an undesired effect. Therefore, if it is preferable to remove the oxide film, it may be removed by any suitable manner, for example, dipping the substrate having the oxide film into hydrochloric acid.

Finally, it should be understood that, in order to form the modified layer, those skilled in the art could readily select any suitable condition for the plasma treatment (such as a treatment power and a treatment period) and any specification of the modified layer (such as a thickness and a carrier concentration) on the basis of the teachings disclosed herein depending on characteristics for an intended application of the element and also on the substrate material, impurity element and so on to be used for the production of the element.

EXAMPLES

The present invention will be, hereinafter, explained by the following Examples with reference to the accompanying drawings. It should be noted that any number in a drawing indicates the same component as the other drawings in which the same number appears.

EXAMPLE 1

(Production Procedure)

FIGS. 1 to 5 show a sequence of one embodiment of a is process for the production of the GaAsMESFET (31) according to the present invention using its cross sectional view. Firstly, an active layer (2) (of which carrier concentration is about $1\times10^{17}$ cm$^{-3}$) is formed on a top of a semiconductor substrate (1) by, for example, the ion implantation method or the MBE (Molecular Beam Epitaxy) method. Then, a patterned resist (not shown) is formed on the active layer (2) by, for example, the photolithography method followed by depositing a metal based Au-Ge/Ni and lifting off unnecessary portions of the metal and the resist to provide a source electrode (3) and a drain electrode (4) on the active layer (2) (see FIG. 1). Both electrodes are then thermally treated to be alloyed.

Figure 2:
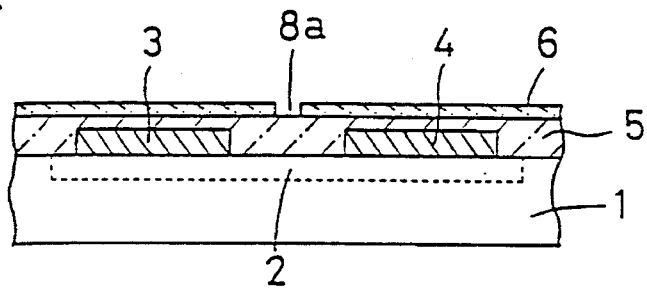

Then, as shown in FIG. 2, a lower resist layer (5) is formed to cover the semiconductor substrate (1), the source electrode (3) and the drain electrode (4) before an upper resist layer (6) having a predetermined pattern is formed on the lower resist layer (5) by applying, sintering, exposing and developing a s resist. The upper resist layer thus formed has an opening (8a) above a region where a gate electrode is to be formed.

Figure 3:
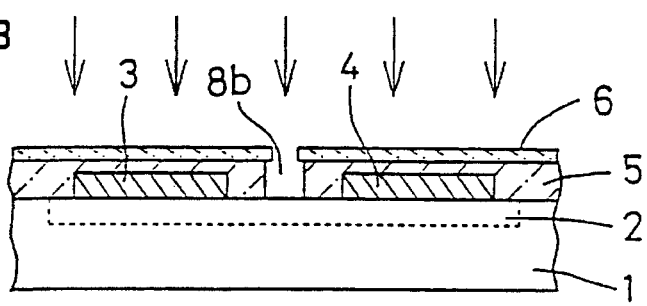

Next, as shown in FIG. 3, the lower resist layer (5) is dry-etched using the upper resist layer (6) as a mask so as to form an opening (8b) which is slightly larger than the opening (8a) above it. Then, the semiconductor substrate (1) is plasma treated through the openings (8a) and (8b). It is noted in FIG. 3 (and any other drawing if applicable), arrows show a direction of plasma radiation. By means of the plasma treatment, a modified layer (2a) is formed in a region of the active layer (2) on which a gate electrode is to be formed and a region which protrudes outwardly from said region. Therefore, it is also possible to form the modified layer continuously after the dry etching.

The plasma treatment as described above can be carried out by, for example, using the RIE equipment. Any gas can be used as a plasma source as far as it is possible to do so. For example, $O_2$, $N_2$, Ar, $CF_4$, $CHF_3$, $H_2$ and any combination thereof can be used as the plasma source.

Figure 4:
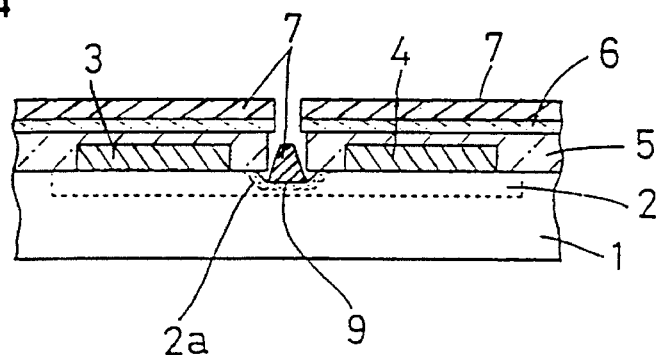

As shown in FIG. 4, the modified layer (2a) of the active layer (2) is subjected to the recess-etching to form a recess (9). Optionally the substrate is subsequently dipped into 6N (normal)-HCl aqueous solution for one minute to remove an oxide film formed on a surface of the modified layer (2a) (not shown) if present, and then a metal such as Ti/Pt/Au or Al is deposited to form a metal layer (7).

As is apparent from the foregoing explanation, impurity ions are neither implanted nor doped into the substrate during this plasma treatment. Therefore, the modified layer has substantially the same impurity concentration as that of the active layer.

Finally, unnecessary portions of the metal (7) are removed together with the lower resist layer (5) and the upper resist layer (6) by lifting off them so as to leave a gate electrode (7a) in the recess (9), which results in an intended GaAs-MESFET.

As described above, the process for the production of the GaAsMESFET in Example 1 is characterized in that the modified layer (2a) is formed with the plasma treatment in the region of the active layer (2) immediately below the gate electrode (7a) which forms a Schottky junction and the vicinity region of said region. Thus, the steps other than the plasma treatment steps are, in principle, similar to those of the prior art.

In this Example, although the plasma treatment was carried out before the recess etching, Example 1 is not limited to such a procedure. The plasma etching may be carried out after the recess etching, and then the gate electrode may be formed. Further, the recess-etching may be eliminated; namely, the gate electrode may be formed without recess-etching after the plasma treatment as shown in FIG. 3.

(Measurement of Element Characteristics)

The plasma treatment was carried out using $O_2$ gas as the plasma source and the RIE equipment under conditions as shown in Table 1 below to produce the GaAsMESFET according to Example 1.

TABLE 1

| Gas ($O_2$) flow rate | Gas ($O_2$) pressure | RF power | Treatment period |
|---|---|---|---|
| 10 SCCM | 100 mTorr | 30 W | 30 min. |

A prior art GaAsMESFET was also produced by repeating the same procedures as described above except that the plasma treatment was not carried out.

Then, a gate current $I_g$ was measured when a reverse bias voltage ($V_{gd}$=–12 V; source: open) was applied between the gate electrode and the drain electrode. In addition, another gate current $I_g$ was also measured when a voltage between the gate electrode and the source electrode ($V_{gs}$) was 0 V and a voltage between the source electrode and the drain electrode ($V_{ds}$) was 9 V.

Figure 38:
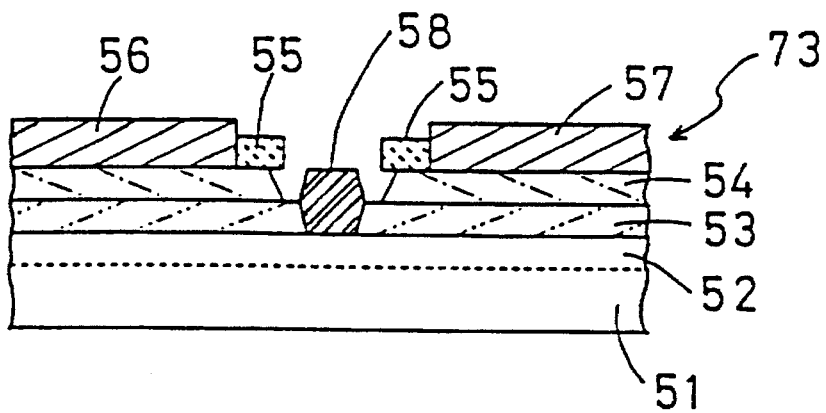
FIG. 38 schematically shows a cross sectional view of a prior art GaAsMESFET of which withstand voltage is improved.
Figure 39:
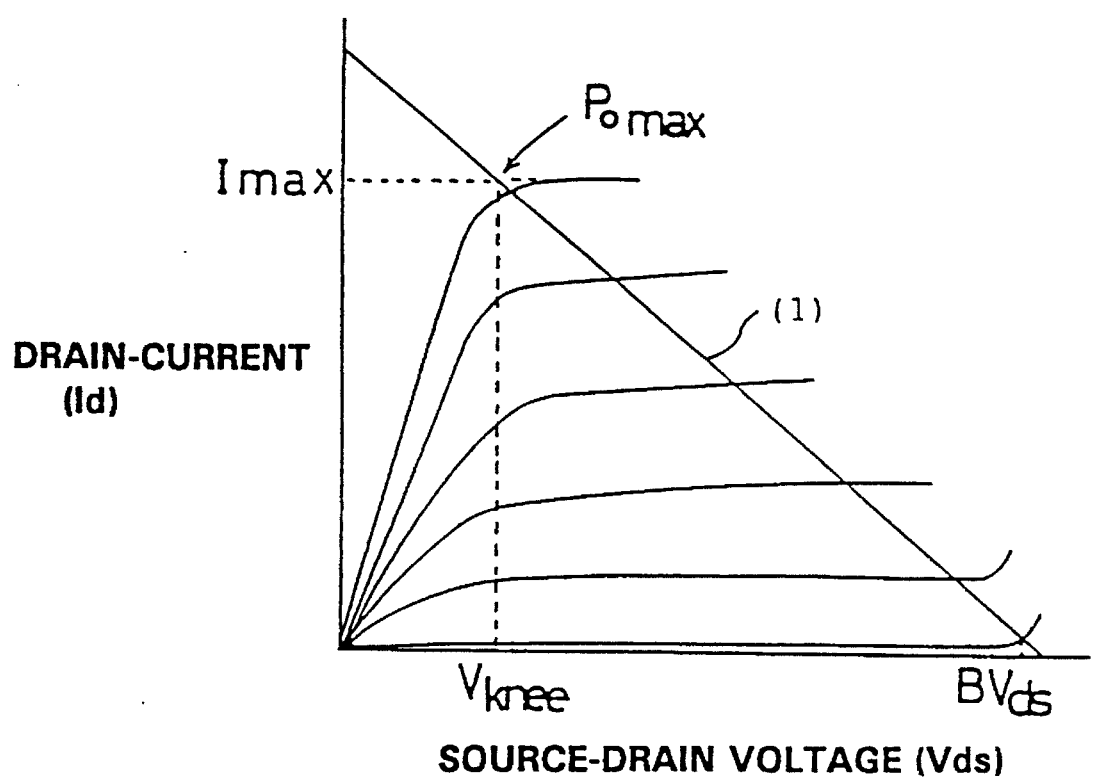
FIG. 39 is a graph which shows a static characteristic and a load curve of a GaAsMESFET element.
Figure 40:
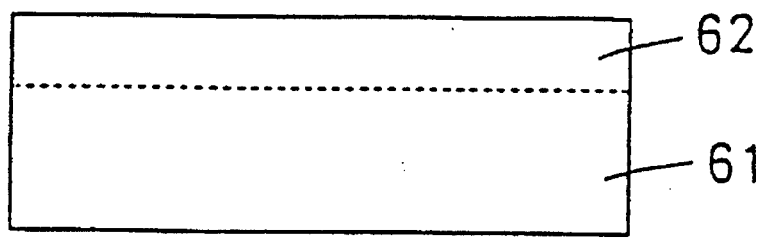
FIG. 40, FIG. 41 and FIG. 42 each schematically show a step of a process for the production of a Schottky barrier diode of the prior art.
Figure 41:
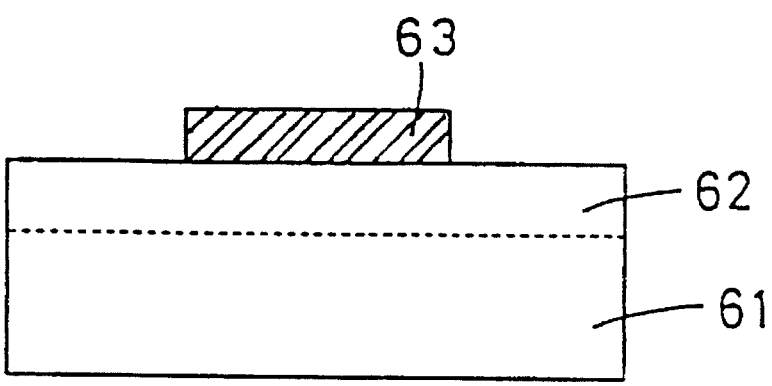
Figure 42:
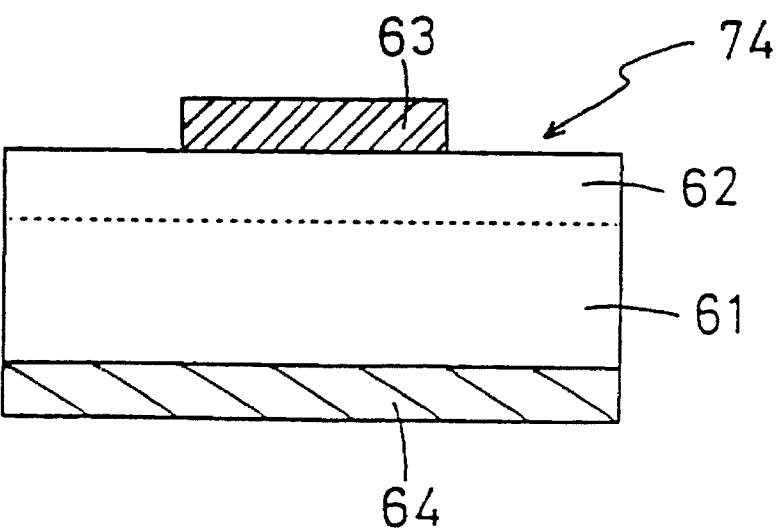

Each of the GaAsMESFET had a gate length of 0.5 µm, a gate width of 300 µm and a recess depth of 0.15 µm. It is seen from results of the measurement in Table 2 shown below that the gate current on the application of the reverse bias voltage in the GaAsMESFET according to Example 1 was greatly decreased to about 1/10 of that of the prior art transistor; that is, the gate withstand voltage is greatly improved. In addition, the gate current $I_g$ obtained when the voltage between the gate electrode and the source electrode ($V_{gs}$) was 0 V and the voltage between the source electrode and the drain electrode ($V_{ds}$) was 9 V is also greatly reduced to about 1/50 of that of the prior art transistor. That is, the gate withstand voltage of the GaAsMESFET of Example 1 was at least comparative with the prior art transistor as shown in FIG. 38 which has the undoped surface layer on the active layer.

TABLE 2

|  | Example 1 | Prior art |
|---|---|---|
| Gate current ($I_g$) on application of reverse bias ($V_{dg}$ = –12V) | 0.15 µA | 1.5 µA |
| Leakage current ($I_g$) when $V_{gs}$ = 0V and $V_{ds}$ = 9V | 0.6 µA | 30 µA |

$V_{gd}$: applied voltage between gate and drain
$V_{ds}$: applied voltage between source and drain
$V_{gs}$: applied voltage between gate and source Further, it was also confirmed that the GaAsMESFET of Example 1 showed no degradation of its characteristics such as trans-conductance ($g_m$) and cut-off frequency ($f_t$), which were substantially the same as those of the prior art transistor.

In addition, when the plasma treatment was carried out under conditions of the RF (radio frequency) power of 80 W and the treatment period of 10 minutes and the element thus produced was tested, its characteristics were almost the same as those of the transistor produced under the conditions shown in Table 1.

The plasma treatment of the semiconductor substrate (1) as described above modifies the active layer (2), whereby a carrier density in the region of the active layer (2) immediately below the gate electrode (7a) and its vicinity is reduced so that the change of surface state density appears to be caused. As a result, a thin higher resistance layer is formed under the gate s electrode (7a) which can buffer an effect of the surface state (which is said to affect the gate withstand voltage and so on). At the same time, electric field concentration at the edge of the gate electrode (7a) or the drain electrode (4) can be decentralized. As a result, the GaAsMESFET (31) is improved in its characteristics; for example, the gate withstand voltage of the GaAsMESFET (31) is improved, and the current leakage is suppressed at the gate.

EXAMPLE 2

(Production Procedure)

FIGS. 6 to 9 show a sequence of another embodiment is of the process for the production of the GaAsMESFET (32) according to the present invention using its cross sectional view, in which an $n^+$-type active layer having a higher carrier concentration is formed in each of a source region and a drain region.

Figure 6:
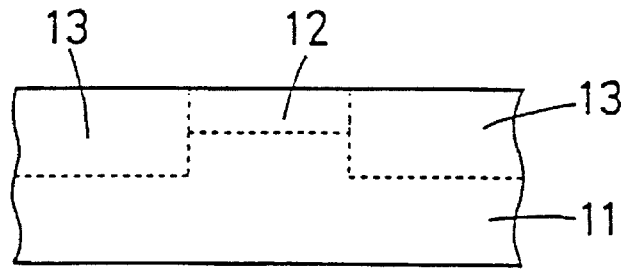
FIG. 6, FIG. 7, FIG. 8 and FIG. 9 each schematically show a step of another embodiment of a process for the production of a GaAsMESFET (Example 2) according to the present invention using a cross sectional view of the transistor.

Firstly, as shown in FIG. 6, an n-type active layer (12) is formed on a top of a semiconductor substrate (11) made of a semi-insulation GaAs produced by the liquid encapsulation Czochralski method (LEC) method as shown in FIG. 6, and an $n^+$-type active layer (13) which has a higher carrier concentration is selectively formed on each side of the n-type active layer (12). For example, n-type ions are implanted through a top of the semiconductor substrate (11) under conditions of an implantation energy of 80 keV and an implantation carrier density of $2 \times 10^{12}$ cm$^{-2}$ so as to form the n-type active layer (12), and then a region except an area where the $n^+$-type active layer (13) is to be formed is covered with a resist (not shown). Then, using the resist as a mask, n-type ions are implanted to a deeper extent than in the n-type active layer under conditions of an implantation energy of 120 keV and a implantation carrier density of $2 \times 10^{13}$ cm$^{-2}$ so as to form the $n^+$-type active layer (13) beneath regions on which a source electrode and a drain electrode are to be formed.

Figure 7:
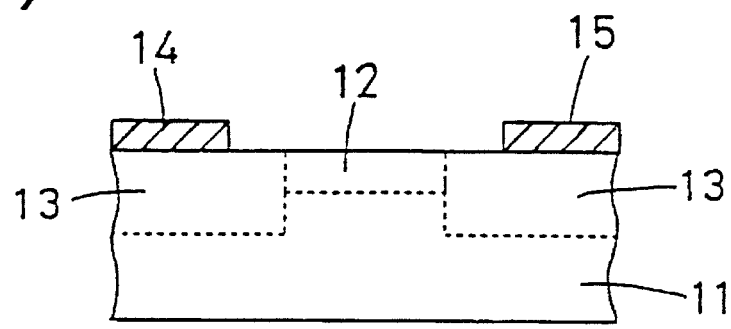
Figure 8:
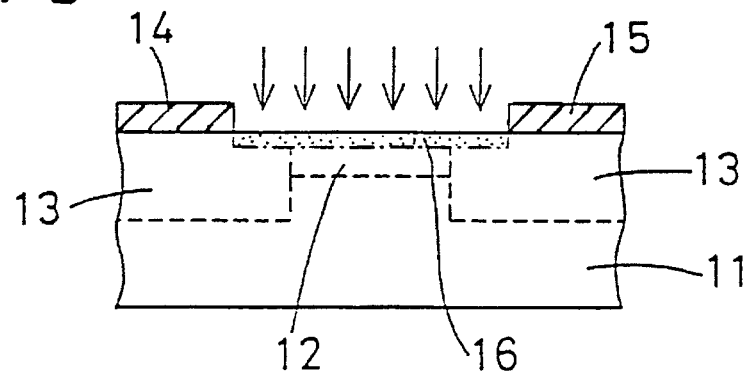

Then, as shown in FIG. 7, an ohmic metal such as a Au-Ge/Ni based metal is deposited on the $n^+$-type active layer (13) to form a source electrode (14) and a drain electrode (15), which are thermally treated to be alloyed. Thereafter, using the source electrode (14) and the drain electrode (15) as masks, the n-type active layer (12) between the electrodes and the $n^+$-type active layers (13) are subjected to plasma radiation so as to form a modified layer (16). It is contemplated that, by the formation of the modified layer (16) thus plasma treated, a state density around surface regions of the n-active layer (12) and the $n^+$-type active layer (13) is changed so that an original state inherent in the semiconductor is compensated to buffer the effect of the surface state. In this Example, any gas can be used as the plasma source as far as it is possible to do so as in the above Example 1. Thus, it is of course, possible to use $O_2$, $N_2$, Ar, $CF_4$, $CHF_3$, $H_2$ and any combination thereof.

As is apparent from the foregoing explanation, impurity ions are neither implanted nor doped into the substrate during this plasma treatment. Therefore, the modified layer has substantially the same impurity concentration as that of the active layer.

Figure 9:
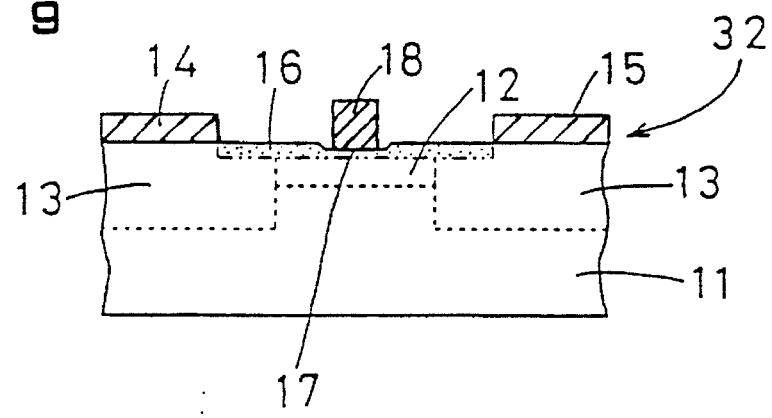

Finally, as shown in FIG. 9, a gate electrode (18) of, for example, Ti/Pt/Au or Al is formed in a recess (17) formed in the modified layer (16) of the n-type active layer (12) to obtain an intended GaAsMESFET (32), optionally after the substrate (11) is dipped into 6N (normal)-HCl aqueous solution for one minute to remove an oxide film formed on a surface of the modified layer (16) (not shown) if present. In this stage, etching for the purpose of the formation of the recess (17) may be carried out after or before the plasma irradiation.

In this way, the GaAsMESFET of a type having the n⁺-type active layer (13) has an improved gate withstand voltage and a reduced current leakage as in the case of Example 1.

(Measurement of Element Characteristics)

The plasma treatment was carried out using $O_2$ gas as the plasma source and the RIE equipment under conditions as shown in Table 3 below to produce the GaAsMESFET according to Example 2. A prior art GaAsMESFET was also produced by repeating the same procedures as the above except that the plasma treatment was not carried out. Each of the GaAsMESFET had a gate length of 0.5 μm, a gate width of 100 μm and a separation of 2.5 μm between the n⁺-type active layers.

TABLE 3

| Gas ($O_2$) flow rate | Gas ($O_2$) pressure | RF power | Treatment period |
| --- | --- | --- | --- |
| 10 SCCM | 50 mTorr | 50 W | 1 min. |

Figure 10:
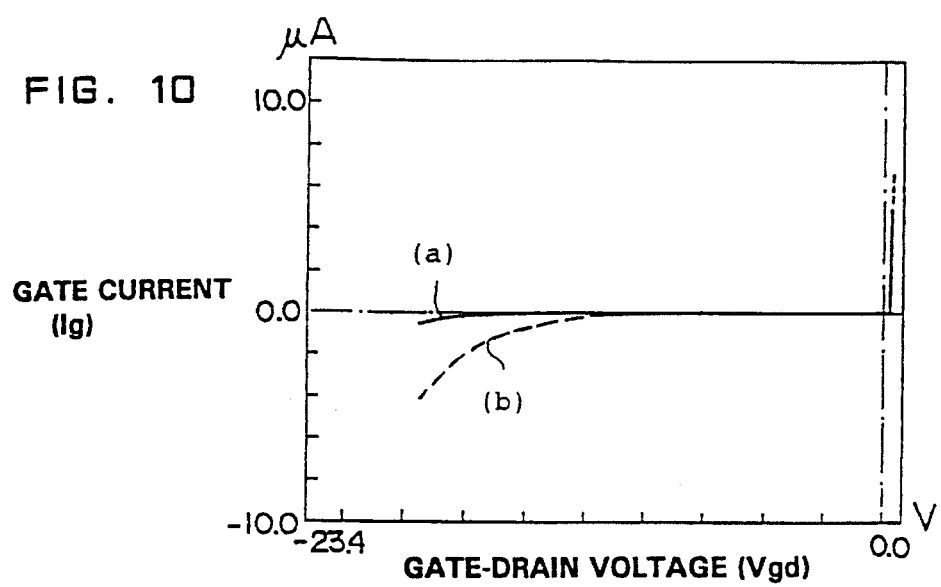
FIG. 10 is a graph which shows measurement results of a gate current and a voltage between a gate electrode and a drain electrode of transistors of Example 2 and a prior art transistor.

A measurement was carried out to determine a relationship between a gate current ($I_g$) and a voltage between the gate electrode and drain electrode ($V_{gd}$), which is shown in FIG. 10 as gate voltage-current characteristic curves. In FIG. 10, the transistor according to Example 2 showed the curve (a) of a solid line, while the transistor of the prior art showed the curve (b) of a dashed line. As seen from the graph, the gate withstand voltage of the transistor of Example 2 is improved in comparison with the transistor of the prior art, and lo the current leakage can be suppressed.

Figure 11:
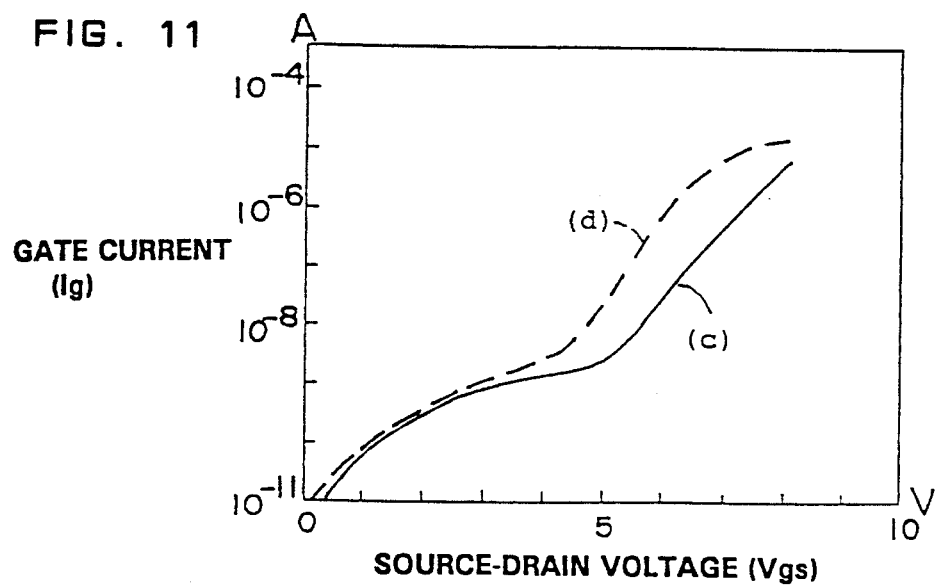
FIG. 11 is a graph which shows measurement results of a gate current and a voltage between a source electrode and a drain electrode of transistors of Example 2 and a prior art transistor.

Further, changes of the gate current ($I_g$) were also measured against a voltage between the source electrode and the drain electrode ($V_{ds}$), of which results are shown in FIG. 11. In the graph, the gate current of the transistor of is Example 2 is shown with a curve (c) using a solid line, while that of the transistor of the prior art is shown with a curve (d) using a dashed line. As seen from the graph of FIG. 11, the gate current is less in the element of Example 2 than in the prior art.

Figure 12:
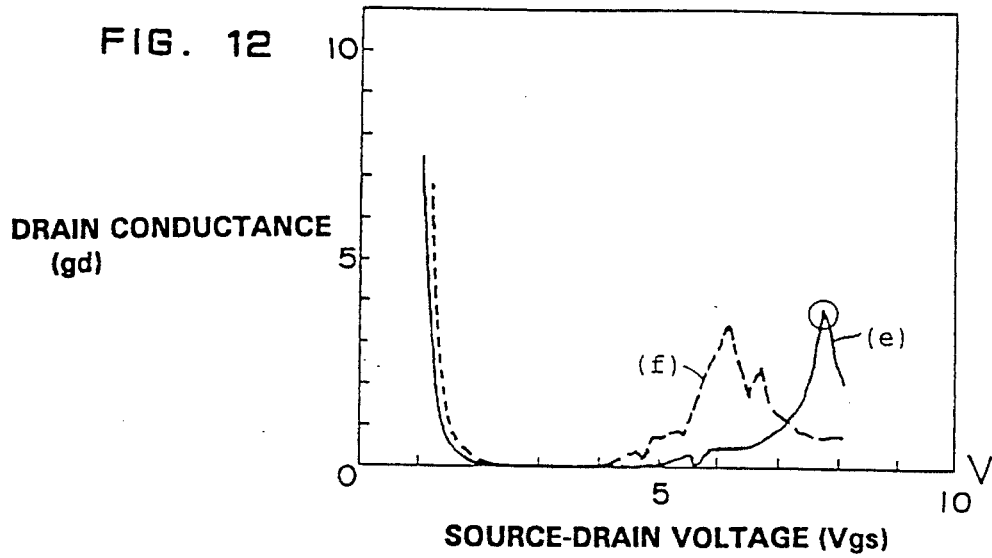
FIG. 12 is a graph which shows measurement results of a drain conductance and a voltage between a gate electrode and a drain electrode of transistors of Example 2 and a prior art transistor.

In addition, changes of a drain conductance (gd) were also measured against a voltage between the source electrode and the drain electrode ($V_{ds}$) at 0 V of a voltage between the gate electrode and the source electrode, of which results are shown in FIG. 12. In the graph, the drain conductance of the transistor of Example 2 is shown with a curve (e) using a solid line, while that of the transistor of the prior art is shown with a curve (f) using a dashed line. As seen from the graph of FIG. 12, the voltage between the source electrode and the drain electrode which gives a peak conductance (gd) (as indicated with a circle in FIG. 12) is higher in the transistor of Example 2 than in the prior art transistor, which means that an internal electric field concentration is decentralized.

According to the measurement results as described above, it is seen that the GaAsMESFET according to the present invention has its output power larger and its reliability greatly enhanced.

EXAMPLE 3

(Production Procedure)

Figure 13:
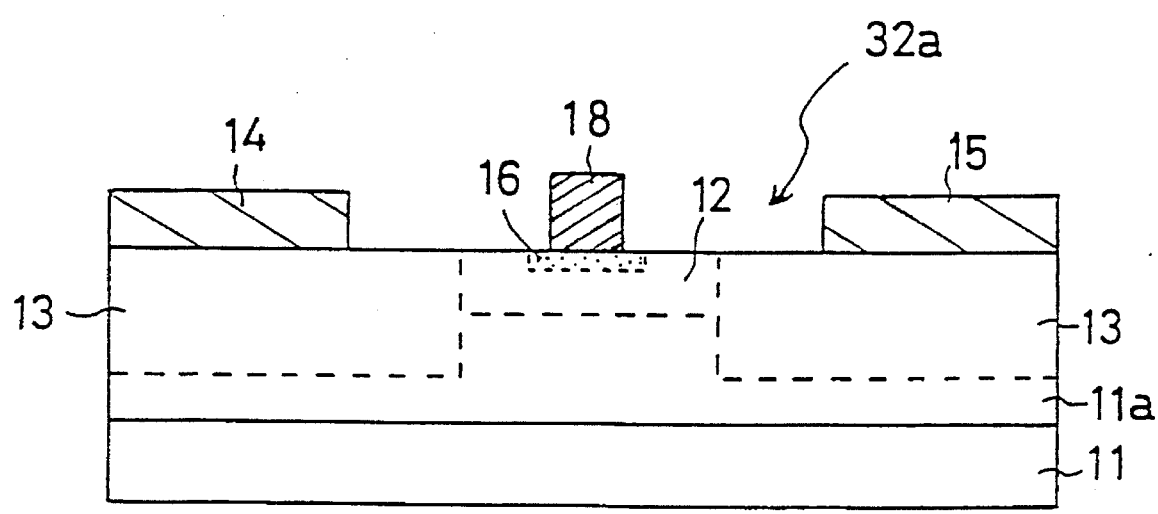
FIG. 13 schematically shows a cross sectional view of a GaAsMESFET element of another example (Example 3)

FIG. 13 shows a further GaAsMESFET (32a) of the present invention in its cross sectional view which also has an n⁺-type active layer (13) having the higher carrier concentration in the source region and the drain region. The transistor (32a) is different from the transistor (32) in that no recess (17) is provided and a surface of the transistor is substantially flat. In addition, the modified layer (16) is formed by irradiating plasma to a slightly larger area than the gate electrode (18) of the n-type active layer (12). A p-type layer (11a) is also provided.

Figure 5:
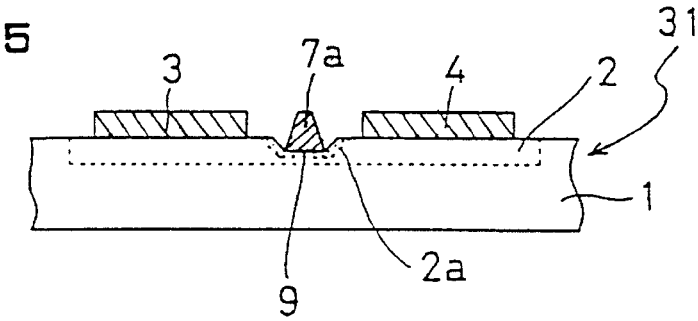

In one embodiment of the present invention, as in the GaAsMESFET (32a) of this Example 3 or the transistor as shown in FIG. 5, the higher resistance region (the modified layer (2a) or (16)) is formed only in a portion of the vicinity of the gate electrode (including the region immediately below the electrode), which enables the element to withstand a higher voltage. In such a structure of the transistor, the formation of the parasitic resistor which lies in series with the channel is prevented which has caused problems in the GaAsMESFET (73) of the prior art. In addition, other regions which are not subjected to the plasma treatment can be given a lower resistance by means of, for example, the ion implantation method so that the higher withstand voltage and the lower resistance are both realized independently. This means the maximum current ($I_{max}$) and the breakdown voltage ($V_{ds}$) can be increased at the same time as and independent from, the reduced knee voltage ($V_{knee}$) in Equation (1), which is highly advantageous for the high output and the high efficiency of the MESFET. In addition, the LDD structure or the multi-step recess structure as exemplified by the prior art can be utilized in combination with the present invention so that the effect of the present invention can be added to that of the prior art.

Further, when an element is made to be of a high resistance partially, a semiconductor layer having a planar structure cannot be formed with the use of the epitaxial growth method. To the contrary, the use of the plasma treatment in combination with the photo-lithography as in the present invention makes it possible to freely form such a planar structure. Thus, the element partially having a higher resistance can have the planar structure, that is, only necessary regions can be subjected to the treatment so as to be of the higher resistance.

EXAMPLE 4

(Production Procedure)

FIG. 14 to 18 schematically show a sequence of a further embodiment of the production process according to the present invention in which a Schottky barrier diode (33) is produced.

Figure 14:
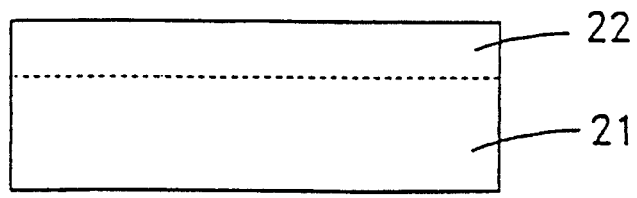
FIG. 14, FIG. 15, FIG. 16, FIG. 17 and FIG. 18 each schematically show a step of one embodiment of a process for the production of a Schottky barrier diode (Example 4) according to the present invention in its cross sectional view.
Figure 15:
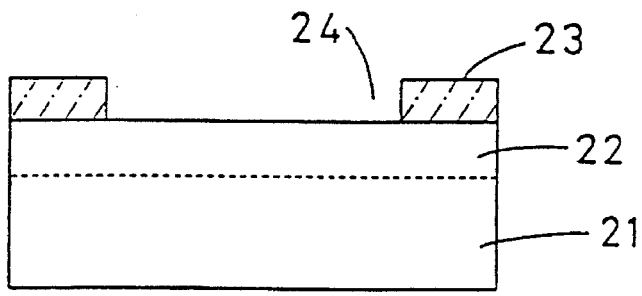

Firstly, as shown in FIG. 14, an n-type active layer (22) is formed with the epitaxial growth method on a low resistance semiconductor substrate (21) having a higher doped impurity concentration made of, for example, n⁺-type GaAs material. Then, as shown in FIG. 15, a resist layer (23) is formed on the n-type active layer (22), which is patterned with the photo-lithography to form an opening (24) through the resist layer (23) on a region where a Schottky electrode is to be formed and its outer peripheral region.

Figure 16:
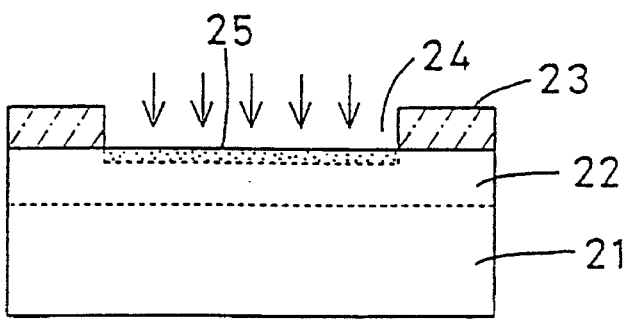

Then, as shown in FIG. 16, the n-type active layer (22) is subjected to the plasma treatment using the resist layer (23) as a mask with, for example, the RIE equipment so that a modified layer (25) is formed in a surface area of the n-type active layer (22). In this way, by the plasma treatment of the n-type active layer (22), a vicinity of the surface region of the n-type active layer (22) can be modified. It is contemplated that the surface state of the modified layer (22) is changed so that the state inherent in the semiconductor substrate (21) is compensated to buffer the effect of the surface state. In this production process, any gas can be used for a plasma source as for as it is possible to do so. For example, $O_2$, $N_2$, Ar, $CF_4$, $CHF_3$, $H_2$ and any combination thereof can be used.

As is apparent from the foregoing explanation, impurity ions are neither implanted nor doped into the substrate during this plasma treatment. Therefore, the modified layer has substantially the same impurity concentration as that of the active layer.

Figure 17:
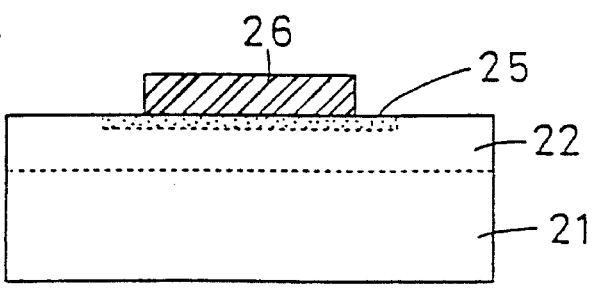

After the plasma irradiation to the n-type active layer (22) as described above, the resist layer (23) is removed. Then, another resist layer (not shown) is formed on the semiconductor substrate (21), and an opening is formed through the resist layer by the lithography so that the opening corresponds to a region where a Schottky electrode is to be formed. Then, the substrate (21) is dipped into 6N (normal)-HCl aqueous solution for one minute to remove an oxide film formed on a surface of the modified layer (25) (not shown) if present, and, as shown in FIG. 17, an electrode material such as Ti/Pt/Au is deposited on the resist layer, which is followed by lifting off the resist layer and unnecessary metal material portions to form the Schottky electrode (26). In this way, the modified layer (25) lies under a broader region consisting essentially of a region immediately below the entire Schottky electrode (26) and its outer periphery region, which decentralizes the electric field concentration at the edge of the Schottky electrode (26).

Figure 18:
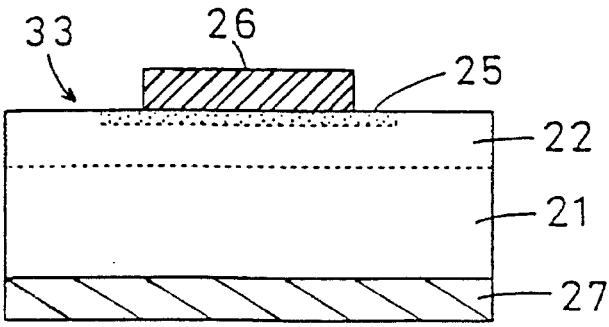

Finally, as shown in FIG. 18, an ohmic electrode (27) of, for example, Au-Ge/Ni is formed on a bottom surface of the semiconductor substrate (21).

(Measurement of Element Characteristics)

Figure 31:
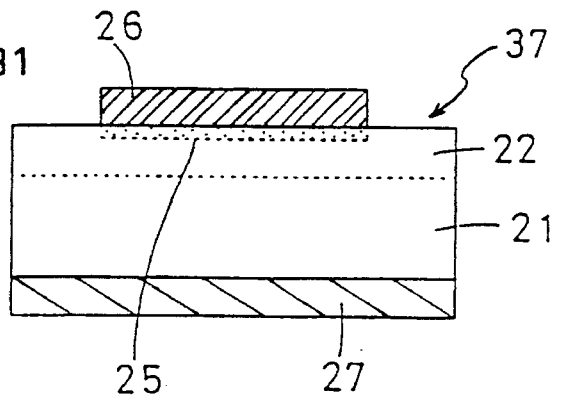

The plasma treatment was carried out using $O_2$ gas as the plasma source and the RIE equipment under conditions as shown in Table 4 below to produce the Schottky barrier diode according to Example 4. A prior art Schottky barrier diode was also produced by repeating the same procedures as the above except that the plasma treatment was not carried out. In addition, another Schottky barrier diode was produced in which only a region immediately below the Schottky electrode was subjected to the plasma treatment (namely, an Schottky barrier diode element as shown in FIG. 31) for a further comparison.

TABLE 4

| Gas ($O_2$) flow rate | Gas ($O_2$) pressure | RF power | Treatment period |
|---|---|---|---|
| 10 SCCM | 50 mTorr | 50 W | 1 min. |

Figure 19:
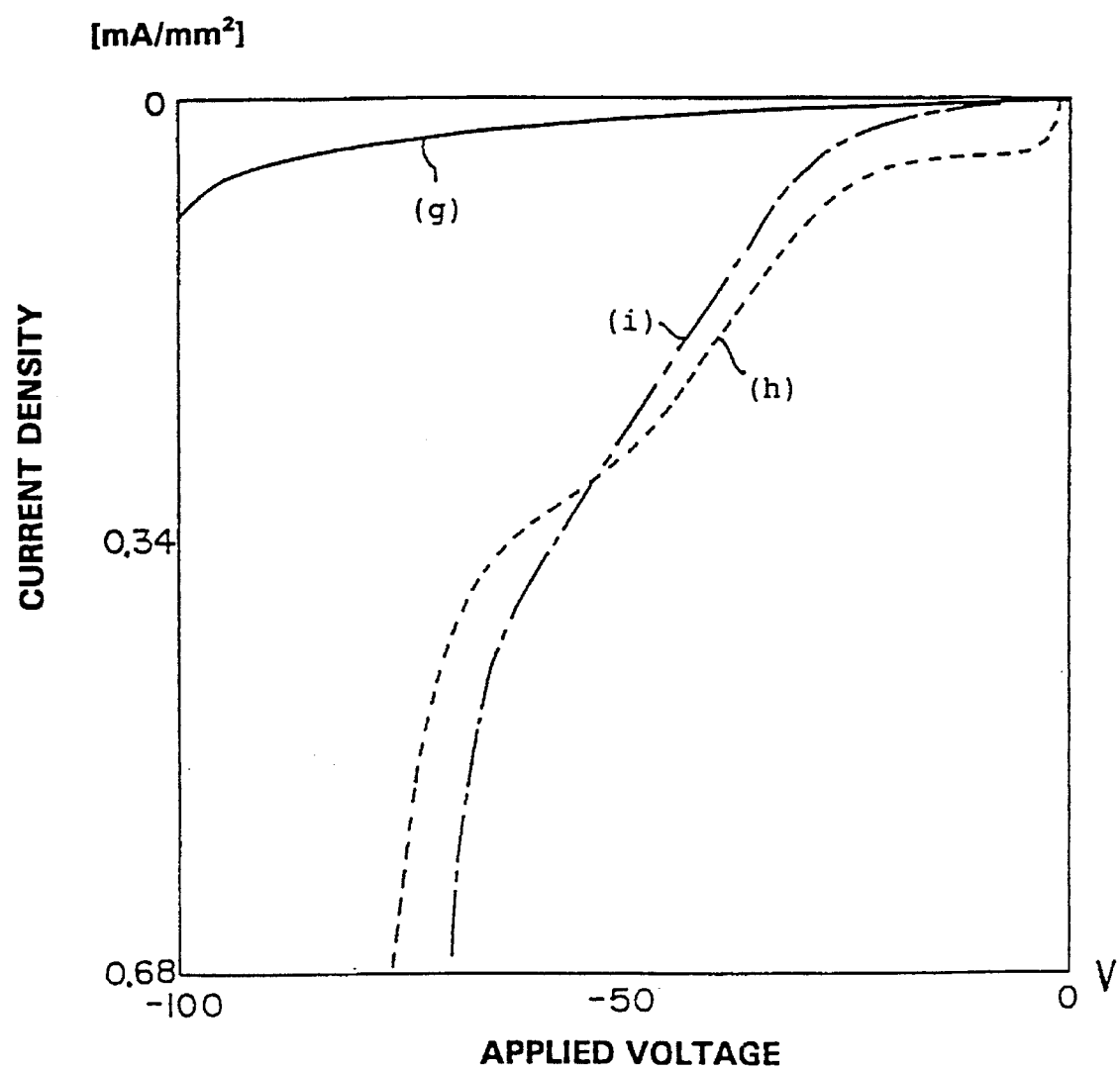
FIG. 19 is a graph which shows a current-voltage characteristic in a reverse mode of a Schottky barrier diode of Example 4, the prior art and a comparative example.

A reverse current-voltage characteristic each of the Schottky barrier diodes of Example 4, the prior art and the comparison was measured. The results of the measurement are shown in a graph of FIG. 19, in which the abscissa indicates an applied voltage between the Schottky electrode and is the ohmic electrode (a reverse voltage) and the ordinate indicates a current density which flows between the Schottky electrode and the ohmic electrode. In the graph, the solid line (g) shows a characteristic curve of the diode of Example 4, the dashed line (h) shows that of the prior art diode, and the alternate long and short dashed line (i) shows that of the comparison diode. As seen from the graph in FIG. 19, it is clear that the reverse characteristic of the Schottky barrier diode of Example 4 is greatly improved to have a larger reverse withstand voltage. In addition, the reverse withstand voltage is highly improved even when compared with the comparison diode in which only the region immediately below the entire of the Schottky electrode has been irradiated with the plasma.

Thus, in Example 4, the modified layer decentralizes the electric field concentration at the edge of the Schottky electrode (namely, the periphery of the electrode) so that the reverse characteristics of the Schottky barrier diode are improved without degradation of the forward characteristics.

EXAMPLE 5

Figure 20:
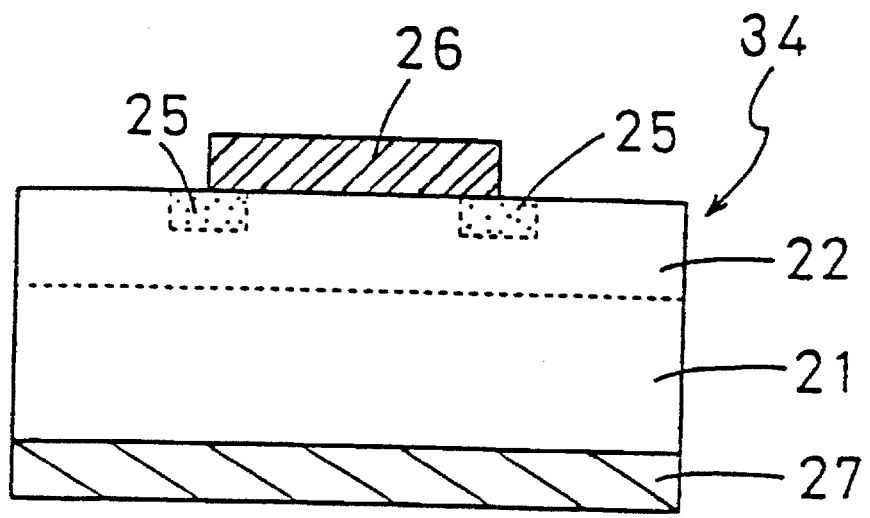
FIG. 20 schematically shows a cross sectional view of a Schottky barrier diode produced in another example (Example 5)

Another embodiment of the Schottky barrier diode (34) according to the present invention is schematically shown in FIG. 20 in its cross sectional view. In this embodiment, only a vicinity of a region which is immediately below an edge region (i.e. a periphery region) of a Schottky electrode (26) has been plasma treated to form a modified layer (25).

Since the modified layer (25) can decentralize the electric field concentration at the edge region of the Schottky electrode (26), the reverse characteristics of the Schottky barrier diode are greatly improved, while keeping the forward characteristics as in the diode shown in FIG. 18.

EXAMPLE 6

Figure 21:
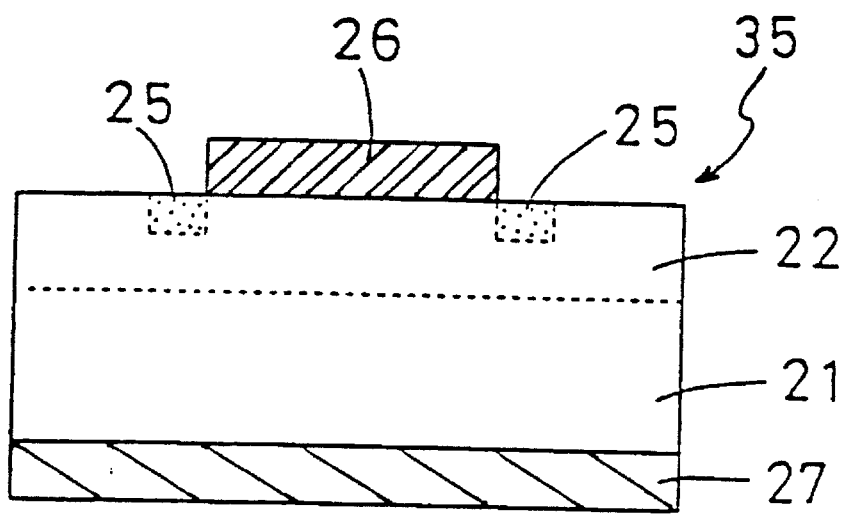
FIG. 21 schematically shows a cross sectional view of a Schottky barrier diode produced in a further example (Example 6)

A further embodiment of the Schottky barrier diode (35) according to the present invention is schematically shown in FIG. 21 in its cross sectional view. In this embodiment, only a region immediately below a periphery of a Schottky electrode (26) and a vicinity just outside this region have been plasma treated to form a modified layer (25).

Since the modified layer (25) can make the electric field concentration decentralized at the edge of the Schottky electrode (26), the reverse characteristics of the Schottky barrier diode are greatly improved, while keeping the forward characteristics as in the diode shown in FIG. 18. In the Schottky barrier diode (35) having the structure as shown in FIG. 21, the modified layer (25) can be formed by the plasma treatment after the Schottky electrode (26) has been formed.

EXAMPLE 7

FIGS. 22 to 26 schematically show a sequence of a further process for the production of the Schottky barrier diode (36) according to the present invention in its cross sectional view. The process is an alternative process for the production of an element whose structure is the same as in the Schottky barrier diode as shown in FIG. 18.

Figure 22:
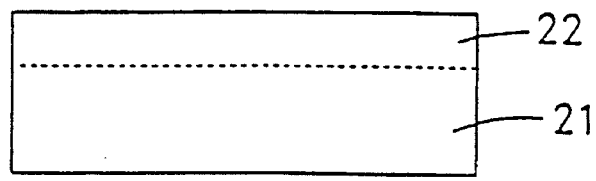
FIG. 22, FIG. 23, FIG. 24, FIG. 25 and FIG. 26 each schematically show a step of a further embodiment of a process for the production of a Schottky barrier diode (Example 7) according to the present invention in its cross sectional view.

Firstly, a resist layer (23) is formed on an n-type active layer (22) which is on a semiconductor substrate (21) having a lower resistance made of, for example, $n^+$-type GaAs as is shown in FIG. 22. Another resist layer (28) is further formed on the resist layer (23).

Figure 23:
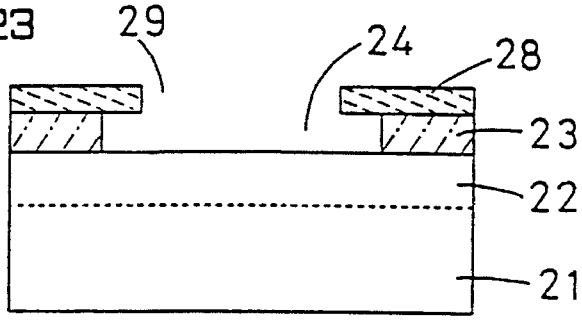

Then, as shown in FIG. 23, the upper resist layer (28) is patterned with the photo-lithography to provide an opening (29) through the resist layer (28) so that the opening corresponds to a region where a Schottky electrode is to be formed. Next, the lower resist layer (23) is etched using the upper resist layer (28) as a mask so that an opening (24) whose mouth is larger than that of the opening (29) of the upper resist layer (28) is formed through the lower resist layer (23).

Figure 24:
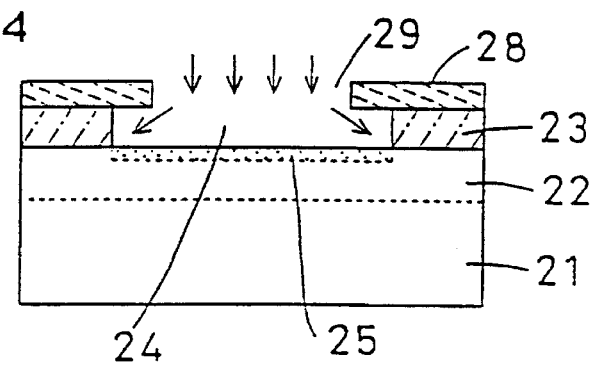
Figure 25:
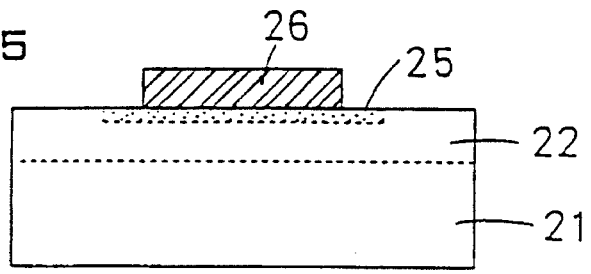
Figure 26:
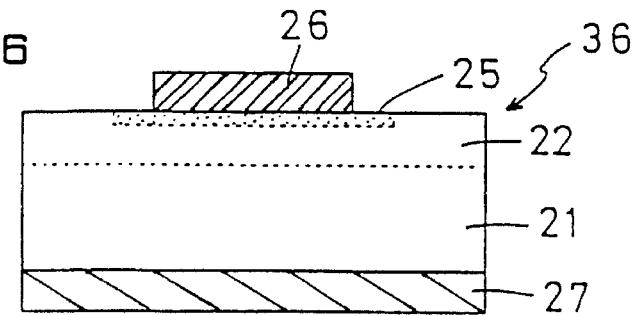

Then, as shown in FIG. 24, the n-type active layer (22) is plasma treated through the openings (29) and (24) to form the modified layer (25) in an exposed region of the n-type active layer. Thereafter, the substrate (21) is dipped into 6N (normal)-HCl aqueous solution for one minute to remove an oxide film formed on a surface of the modified layer (25) (not shown) if present, and then an electrode material such as Ti/Pt/Au is s deposited on the modified layer (25) through the opening (29) of the upper resist (28) followed by lifting off unnecessary metal portions and the resists to obtain the Schottky electrode (26) as shown in FIG. 25. Then an ohmic electrode (27) is formed on a bottom surface of the semiconductor substrate (21) using, for example, Au-Ge/Ni as shown in FIG. 26.

EXAMPLE 8

FIGS. 27 to 31 schematically show a sequence of a further process for the production of the Schottky barrier diode (37) according to the present invention in its cross sectional view.

Figure 27:
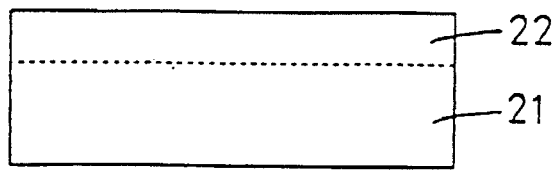
FIG. 27, FIG. 28, FIG. 29, FIG. 30 and FIG. 31 each schematically show a step of a further embodiment of a process for the production of a Schottky barrier diode (Example 8) according to the present invention in its cross sectional view.

Firstly, as shown in FIG. 27, an n-type active layer (22) is epitaxially formed on a semiconductor substrate (21) made of, for example, $n^+$-type GaAs having a lower resistance which has been doped with an impurity in a higher concentration.

Figure 28:
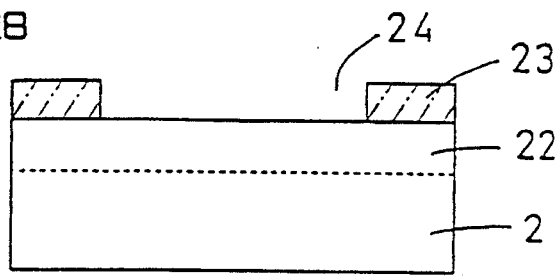

Then, as shown in FIG. 28, a resist layer (23) formed on an n-type active layer (22) is patterned with the photolithography to provide an opening (24) through the resist layer (23) so that the opening corresponds to a region where a Schottky electrode is to be formed.

Figure 29:
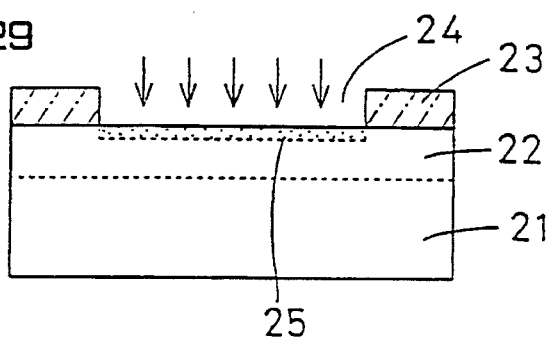

Thereafter, as shown in FIG. 29, a modified layer (25) is formed in a surface of the n-type active layer by irradiating plasma with the RIE equipment using the resist layer (23) as a mask. By the plasma treatment of the n-type active layer (22) in this way, the vicinity of the n-type active layer surface can be modified. This is because a surface state of the n-type active layer is changed, the original state inherent in the semiconductor substrate (21) is compensated and the effect of the surface state is buffered. In this production process, any gas can be used for a plasma source as far as it is possible to do so. For example, $O_2$, $N_2$, Ar, $CF_4$, $CHF_3$, $H_2$ and any combination thereof can be used.

As is apparent from the foregoing explanation, impurity ions are neither implanted nor doped into the substrate during this plasma treatment. Therefore, the modified layer has substantially the same impurity concentration as that of the active layer.

Figure 30:
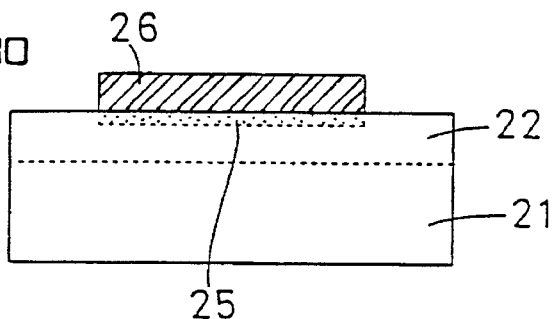

After the plasma irradiation of the n-type active layer (22) as described above, the substrate (21) is dipped into 6N (normal)-HCl aqueous solution for one minute to remove an oxide film formed on a surface of the modified layer (25) (not shown) if present, then an electrode material such as Ti/Pt/Au is deposited from the above of the resist layer (23) on the modified layer (25), and the Schottky electrode (26) is formed by lifting off as shown in FIG. 30. In this way, the modified layer (25) is formed in a region of the active layer (22) which corresponds to the entire a bottom surface of the Schottky electrode (26).

Finally, as shown in FIG. 31, an ohmic electrode (27) made of, for example, Au-Ge/N is formed on a bottom surface of the semiconductor substrate (27).

(Measurement of Element Characteristics)

The plasma treatment was carried out using $O_2$ gas as the plasma source and the RIE equipment under conditions as shown in Table 5 below to produce the Schottky barrier diode element according to Example 8. A prior art Schottky barrier diode was also produced by repeating the same procedures as the above except that the plasma treatment was not carried out.

TABLE 5

| Gas ($O_2$) flow rate | Gas ($O_2$) pressure | RF power | Treatment period |
|---|---|---|---|
| 10 SCCM | 50 mTorr | 50 W | 2 min. |

Figure 32:
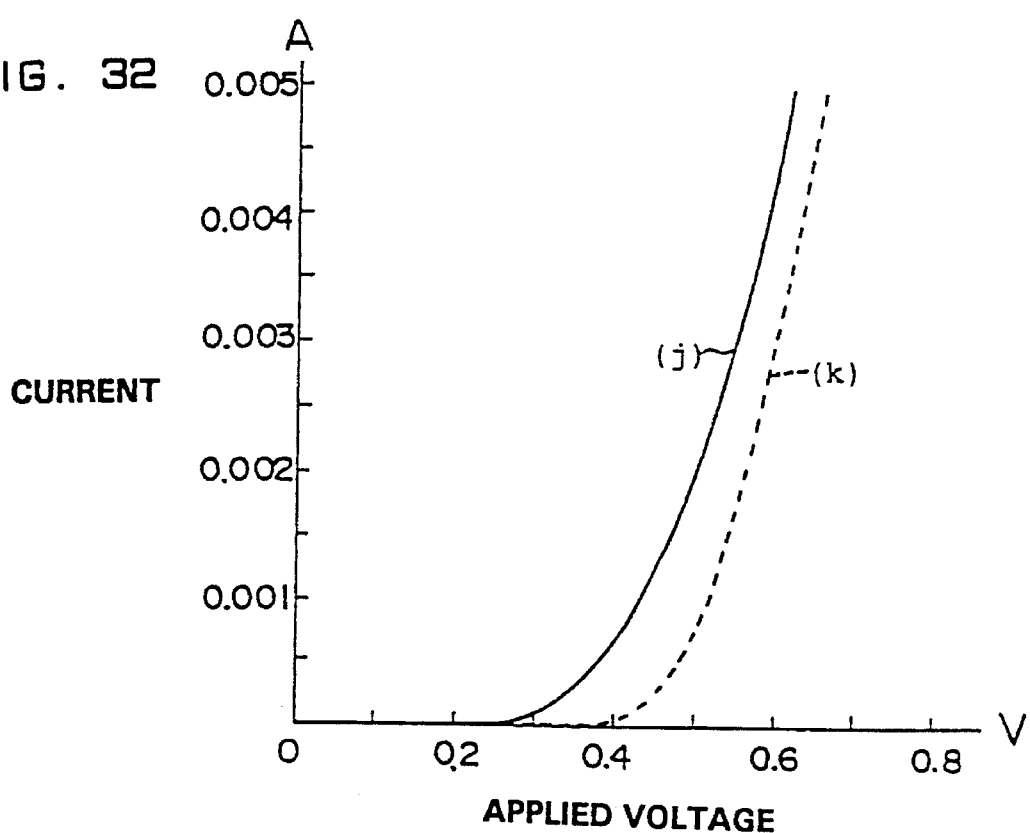
FIG. 32 is a graph which shows a current-voltage characteristic in a forward mode of a Schottky barrier diode of Example 8 and the prior art.
Figure 33:
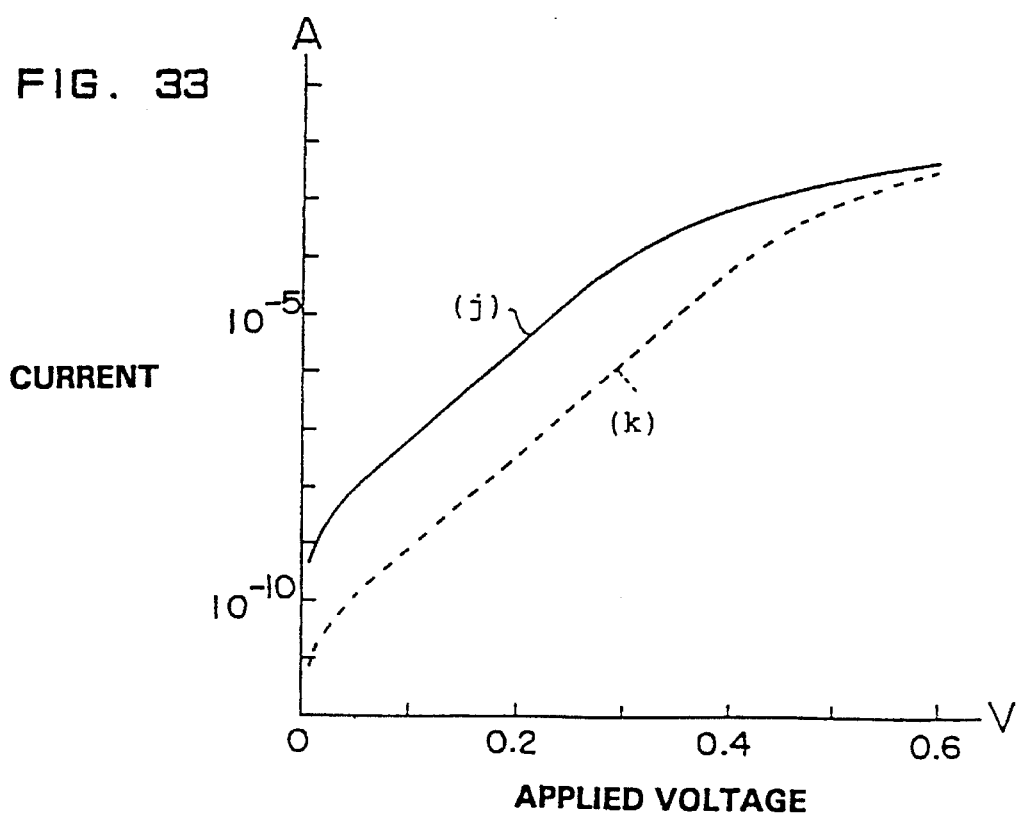
FIG. 33 is a graph which shows a current-voltage characteristic in a forward mode of a Schottky barrier diode of Example 8 and the prior art.
Figure 34:
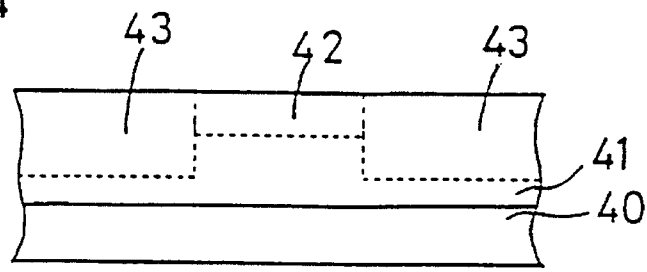
FIG. 34, FIG. 35 and FIG. 36 each schematically show a step of a process for the production of a prior art GaAs-MESFET having a typical structure in its cross sectional view.
Figure 35:
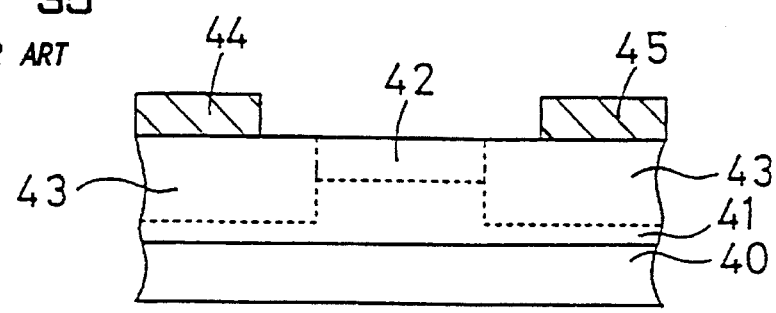
Figure 36:
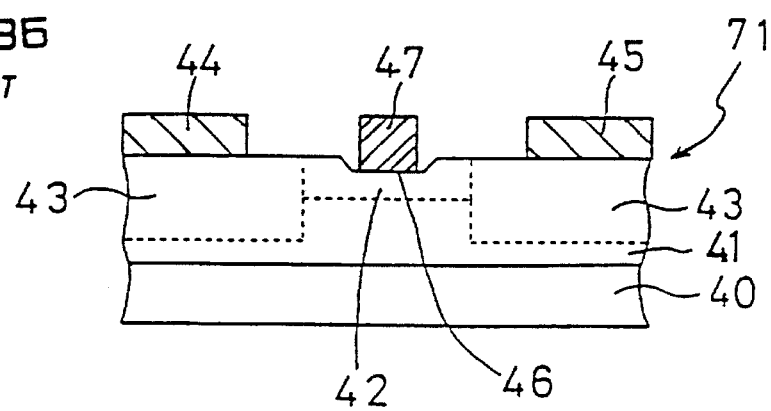
Figure 37:
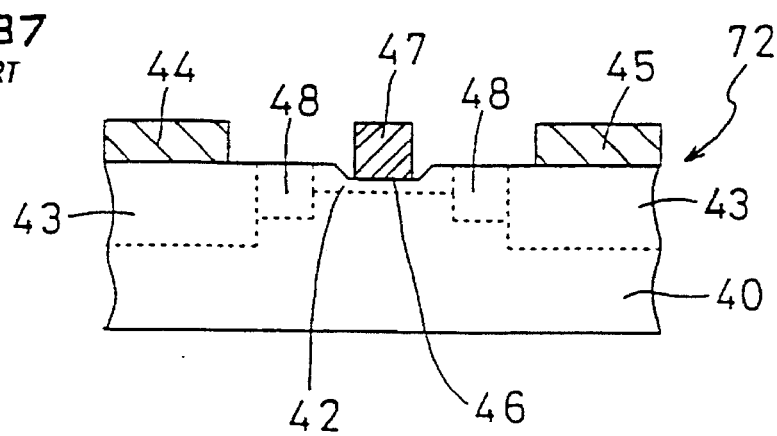
FIG. 37 schematically shows a cross sectional view of a prior art GaAsMESFET element having a LDD structure.

A forward current-voltage characteristic of each of the Schottky barrier diodes of Example 8 and the prior art was measured. The results of the measurement are shown in a graph of FIG. 32, in which the abscissa indicates an applied voltage between the Schottky electrode and the ohmic electrode (a forward voltage) the ordinate indicates a current which flows between the Schottky electrode and the ohmic electrode. In the graph, the solid line (j) shows a characteristic curve of the diode of Example 8 and the dashed line (k) shows that of the prior art diode. As seen from the graph in FIG. 32, it is clear that the forward characteristic of the Schottky barrier diode of Example 8 is improved in comparison with the prior art diode. FIG. 33 is a graph which shows the curves (j) and (k) graph of FIG. 32 using a logarithmic scale for the current. When a barrier height ($\Phi_{BfV}$) of the Schottky junction of each diode was calculated from a slope of the curve, $\Phi_{BfV}$=0.64 eV in the diode of Example 8 while $\Phi_{BfV}$=0.76 eV in the prior art diode. Thus, according to Example 8 of the present invention, the barrier height of the Schottky junction can be reduced while the carrier concentration is not changed in the n-type active layer or the $n^+$-type semiconductor substrate. On the other hand, the reverse characteristic measured was similar to that of the prior art (see curve (i) in FIG. 19).

Thus, the n-type active layer is modified in the region which is immediately below the Schottky electrode 26 according to Example 8 so that the barrier height of the Schottky electrode (26) is reduced, whereby the forward characteristics of the Schottky barrier diode (37) can be improved without degradation of the reverse characteristics of the diode. In FIG. 31, an entire lower surface of the Schottky electrode (26) contacts an entire upper surface of the modified layer (25). However, the upper surface of the modified layer (25) may be present within a narrower region than the lower surface of the s Schottky electrode (26).

Considering the above Examples 4 to 8, it is understood that, in the Schottky barrier diode element, the formation of the modified layer by the plasma treatment of almost all of the region immediately below the Schottky electrode improves the forward characteristics, and the formation of the modified layer in the region of the periphery area and the region adjacent to the periphery area of the Schottky electrode by the plasma treatment improves the reverse characteristics of the diode. In addition, the formation of the modified layer in the region which is immediately below the entire Schottky electrode and the outer peripheral area of such a region improves both of the forward and the reverse characteristics.

The equipment and the conditions for the plasma treatment are not limited to those described in the above Examples. They can be optionally selected depending on, for example, the compound semiconductor substrate to be used and its properties (such as its carrier concentration, its structure and so on).

Although the above Examples have been described with reference to the GaAsMESFET and the Schottky barrier diode, it should be understood that the present invention resides in that at least a portion of the region where the Schottky electrode is formed on the active layer of the semiconductor substrate and the region near said region is subjected to the plasma treatment before (optionally after) the formation of the Schottky electrode on the active layer of the semiconductor substrate. Therefore, the present invention can be generally applied to not only to the GaAsMESFET and the Schottky barrier diode but also to a compound semiconductor element having the Schottky junction between a metal and a semiconductor such as a HEMT, a planar type Schottky barrier diode and so on. In addition, in the case of the GaAsMESFET and the Schottky barrier diode, their structures and their production process are not limited to those of the above Examples, and other structure of a semiconductor element and its production process may be used according to the present invention.

As described above, according to the process for the production of the semiconductor element, the plasma treatment forms the modified layer in the region immediately below the Schottky electrode which forms the Schottky junction with the active layer and its vicinity region. This is because the carrier concentration of the active layer immediately below the Schottky electrode and its vicinity is decreased and the surface state density is changed so that the characteristics of the semiconductor element are improved. In addition, the electric field concentration is decentralized at the edges of the gate electrode and the drain electrode.

For example, in the field effect transistor such as a GaAsMESFET, the gate withstand voltage can be improved and the current leakage at the gate electrode can be suppressed. Further, in the diode such as a Schottky barrier diode, the forward and the reverse characteristics of the diode are improved.

The plasma treatment as described above is carried out before the formation of the Schottky electrode (optionally after the formation thereof when possible) so that the treatment can be generally applied to the production of the semiconductor element having the Schottky junction with the active layer of the semiconductor substrate regardless of its structure and production process.

That is, the semiconductor element which has the good characteristics such as a high withstand voltage without a complicated structure is produced with the simple plasma treatment without any complicated process step control and any specific equipment. Therefore, the present invention can greatly reduce the costs of the production and the raw material for the semiconductor element.

What is claimed is:

1. A semiconductor element comprising a Schottky electrode which forms a Schottky junction with an active layer formed on a compound semiconductor substrate characterized in that a modified layer is formed by plasma treatment in at least a portion of a region of the active layer, in which region the Schottky electrode is formed, wherein the modified layer has a higher resistance than that of the active layer and said active layer and modified layer have substantially a same impurity concentration.

2. The semiconductor element according to claim 1 wherein the modified layer is further formed in a vicinity of said region in which the Schottky electrode is formed.

3. The semiconductor element according to claim 2, wherein the modified layer is formed in the entire said region in which the Schottky electrode is formed.

4. The semiconductor element according to claim 1, wherein the modified layer is formed in the entire said region in which the Schottky electrode is formed.

5. The semiconductor element according to claim 1 wherein the element is a field effect transistor in which two ohmic electrodes are formed on the active layer in addition to the Schottky electrode.

6. The semiconductor element according to claim 1 wherein the element is a Schottky barrier diode and the modified layer is formed in a peripheral region immediately below a periphery area of the Schottky electrode and a region which is adjacent to said peripheral region.

7. The semiconductor element according to claim 1 wherein the element is a Schottky barrier diode and the modified layer is formed in a region immediately below at least part of the Schottky electrode.

8. The semiconductor element according to claim 7, wherein the modified layer is formed in a region immediately below the entire Schottky electrode.

9. The semiconductor element according to claim 1 wherein the element is a Schottky barrier diode and the modified layer is formed in an underlying region immediately below the entire Schottky electrode and a region which protrudes from said underlying region.

* * * * *